United States Patent [19]

Wei et al.

[11] Patent Number: 5,349,229
[45] Date of Patent: Sep. 20, 1994

[54] LOCAL INTERCONNECT FOR INTEGRATED CIRCUITS

[75] Inventors: Che-Chia Wei, Plano; Fu-Tai Liou, Carrollton, both of Tex.

[73] Assignee: SGS-Thomson Microelectronics, Inc., Carrollton, Tex.

[21] Appl. No.: 830,129

[22] Filed: Jan. 31, 1992

Related U.S. Application Data

[62] Division of Ser. No. 648,554, Jan. 31, 1991, Pat. No. 5,124,280.

[51] Int. Cl.⁵ .............................................. H01L 23/48
[52] U.S. Cl. ..................................... 257/383; 257/755
[58] Field of Search .................. 357/59 I, 67 S, 71 S; 257/383, 755

[56] References Cited

U.S. PATENT DOCUMENTS 4,476,482  10/1984  Scott et al. ............................. 257/755
4,975,756  12/1990  Haken et al. ........................... 257/383

Primary Examiner—Robert Limanek
Attorney, Agent, or Firm—Kenneth C. Hill; Lisa K. Jorgenson; Richard K. Robinson

[57] ABSTRACT

Local interconnect is defined in a polycrystalline silicon layer. Openings to underlying conducting regions are made through an insulating layer after the local interconnect conductor definition. A thin extra polycrystalline silicon layer is then deposited over the device and etched back to form polycrystalline silicon sidewall elements. These sidewalls connect the polycrystalline silicon local interconnect conductors to the underlying conductive regions. Standard silicidation techniques are then used to form a refractory metal silicide on the exposed underlying conductive regions, the polycrystalline silicon sidewall elements, and the polycrystalline silicon local interconnect conductors. This results in a complete silicided connection between features connected by the local interconnect conductors.

4 Claims, 1 Drawing Sheet

LOCAL INTERCONNECT FOR INTEGRATED CIRCUITS

This is a division of application Ser. No. 07/648,554 filed Jan. 31, 1991, now U.S. Pat. No. 5,124,280, issued Jun. 23, 1992.

BACKGROUND OF THE INVENTION

1. Field of the Invention

The present invention relates generally to semiconductor integrated circuits, and more specifically to techniques for forming conductive interconnection on such devices.

2. Description of the Prior Art

Local interconnect has been used to achieve improved packing density in sub-micron integrated circuit designs. Local interconnect is an extra level of interconnect used for connecting closely spaced elements in a layout design. Local interconnect typically does not cross over any portion of other interconnect layers, although it may cross over field oxide regions.

Numerous techniques have been used to implement local interconnect. These techniques typically introduce new processing technologies above and beyond those used for the remainder of the device fabrication process flow. Such techniques include, for example, the use of titanium nitride or refractory metals for the local interconnect. Selective deposition of refractory metals on silicon has also been proposed for local interconnect. The quality of the conducting element formed using such techniques varies, with some techniques resulting in fairly good conductors. However, such techniques typically introduce additional process complexity to the normal process flow. This additional complexity tends to decrease device yield and increase cost.

It is desirable to use local interconnect in integrated circuit design, because of the layout area savings. It would be desirable to provide a local interconnect fabrication technique which does not introduce additional process complexities.

SUMMARY OF THE INVENTION

It is therefore an object of the present invention to provide a method for forming local interconnect for semiconductor integrated circuit devices, and to provide the structure formed by such method.

It is a further object of the present invention to provide such a structure and method which uses relatively well understood process technologies.

It is another object of the present invention to provide such a structure and method which provides reliable, low resistance conducting elements.

Therefore, according to the present invention, local interconnect is defined in a polycrystalline silicon layer. Openings to underlying conducting regions are made through an insulating layer after the local interconnect conductor definition. A thin extra polycrystalline silicon layer is then deposited over the device and etched back to form polycrystalline silicon sidewall elements. These sidewalls connect the polycrystalline silicon local interconnect conductors to the underlying conductive regions. Standard silicidation techniques are then used to form a refractory metal silicide on the exposed underlying conductive regions, the polycrystalline silicon sidewall elements, and the polycrystalline silicon local interconnect conductors. This results in a complete silicided connection between features connected by the local interconnect conductors.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
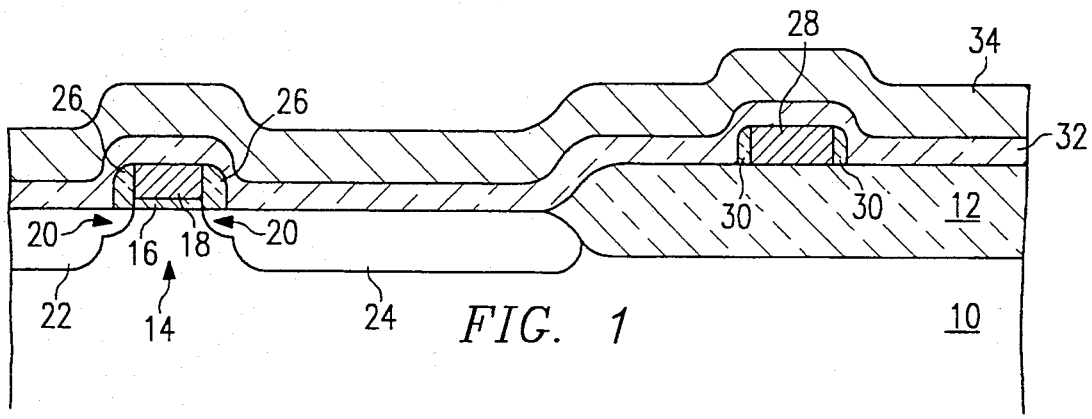
FIGS. 1–4 illustrate a preferred process flow for forming local interconnect structures according to the present invention.

Referring to FIG. 1, an integrated circuit device is to be formed in a semiconductor substrate 10. Field oxide regions 12 are used to separate active regions of the device. Active devices such as field effect transistors are formed in such active regions.

Transistor 14 includes a thin gate oxide 16 and a polycrystalline silicon gate electrode 18. Gate electrode 18 may be, as known in the art, doped polycrystalline silicon, a refractory metal silicide, or a combination of layers of polycrystalline silicon and a refractory metal silicide.

Transistor 14 includes lightly doped drain regions 20 and source/drain regions 22, 24. Lightly doped drain regions 20 are defined using sidewall oxide spacers 26 as known in the art.

Polycrystalline silicon signal line 28 rests on field oxide region 12. Gate electrode 18 and signal line 28 are both preferably formed from the first level polycrystalline silicon interconnect layer, so that sidewall oxide regions 30 are formed on either side of signal line 28. Since gate electrode 18 and signal line 28 are formed simultaneously, they are both constituted from the same materials, preferably being a silicided polycrystalline silicon as described above.

Device fabrication up to this stage utilizes conventional process steps well known in the art. For purposes of illustrating the preferred technique for forming local interconnect, it will be assumed that a local interconnect conductor needs to be formed between source/drain region 24 and signal line 28. The first step in forming such local interconnect is to deposit an oxide insulating layer 32 over the integrated circuit device. Oxide layer 32 may be deposited, for example, to a depth of approximately 1,000 angstroms. A layer of polycrystalline silicon 34 is then deposited over the insulating layer 32, preferably to a depth of approximately 2,000 angstroms.

Figure 2:
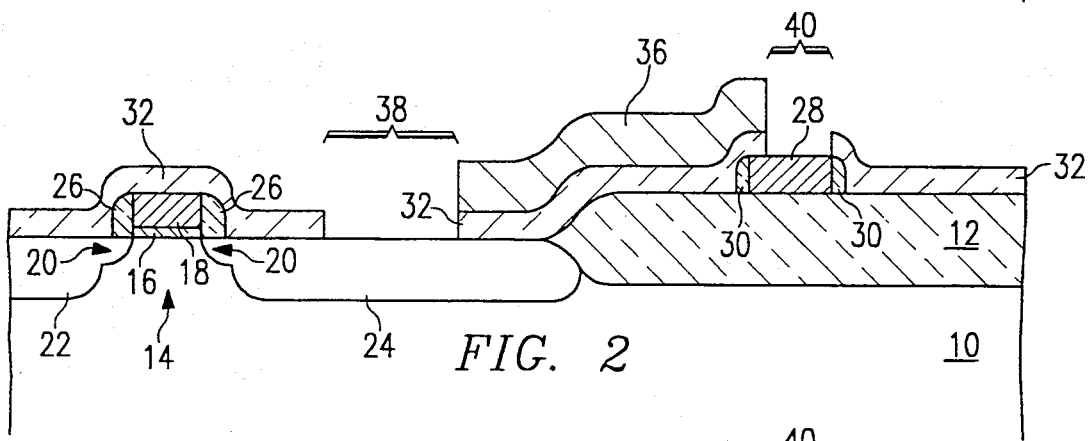

Referring to FIG. 2, polycrystalline silicon layer 34 is patterned and etched to define a local interconnect conductor 36. The oxide layer 32 is used as an etch stop for this step. The oxide layer 32 is then patterned and etched to define openings 38 and 40. This etch step is partially self-aligned in that the polycrystalline silicon conductor 36 acts as a mask for those oxide regions lying immediately beneath it. The remaining sides of the openings 38, 40 are defined solely by the photolithography used to form them. This partial self-alignment insures that the conductor 36 extends to the very edge of each of the openings 38, 40, which is necessary for the later process steps. The conductor 36 will typically actually extend into the opening 38 when viewed from above. This partial self-alignment also means that alignment tolerances may be loosened to some degree.

Figure 3:
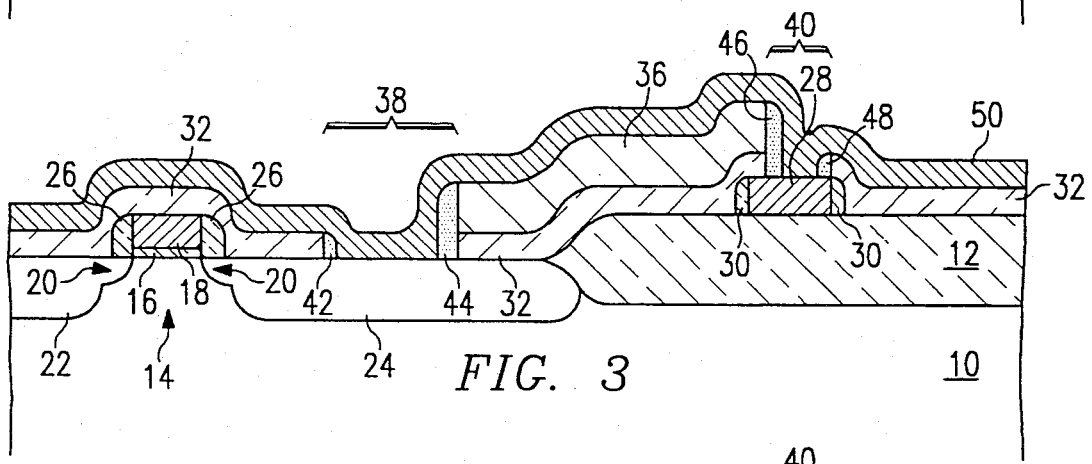

Referring to FIG. 3, a thin layer of polycrystalline silicon is deposited over the surface of device, and then anisotropically etched back. As is known in the art, an unmasked, anisotropic etch back results in the formation of sidewalls along vertical surfaces. Application of this process step to the structure of FIG. 2 results in the formation of polycrystalline silicon sidewall regions 42, 44, 46, 48, along the vertical sides of the openings 38, 40. These sidewall regions 42–48 will have a thickness approximately equal to the original deposition depth of the thin polycrystalline silicon layer, which is preferably deposited to a depth of a few hundred angstroms prior to etch back.

It will be noted that formation of the sidewall regions 44 and 46 cause a polycrystalline silicon connection to be made between the conductor 36 and the underlying source/drain 24 and signal line 28 regions. Sidewall regions 42 and 48 are not needed, but are simply formed as an artifact of the process for forming regions 44 and 46. Although sidewall regions 42 and 48 are not necessary, neither are they harmful since they do not connect to any other conductive structures.

If desired, an alternative technique may be used which does not result in formation of the sidewall regions 42 and 48. In this alternative method, formation of the openings 38, 40 is performed ming an anisotropic etch as described. An isotropic etch is then performed to etch away a relatively thin layer of oxide. This isotropic etch causes an undercut to be etched under the conductor 36. Alternatively, an anisotropic etch can be used to define the openings 38, 40, followed by an isotropic etch to form the undercuts. Deposition of the thin polycrystalline layer will fill the undercut regions. The thin layer can then be isotropically etched to completely remove the sidewalls 42–48. As before, an anisotropic etch can be followed by an isotropic etch if desired. A polycrystalline silicon region will remain in the undercut and extend from the conductor 36 to the underlying conductive region 24 or 28. This undercut region will be protected from the etch back by the overhanging conductor 36.

After formation of the sidewall regions 42–48, a layer of refractory metal 50 is deposited over the entire surface of the device. This layer 50 may be titanium, for example, or it may be another metal which makes a highly conductive silicide when alloyed with polycrystalline silicon as known in the art. The refractory metal layer 50 is typically deposited to a depth of 200–500 angstroms.

Figure 4:
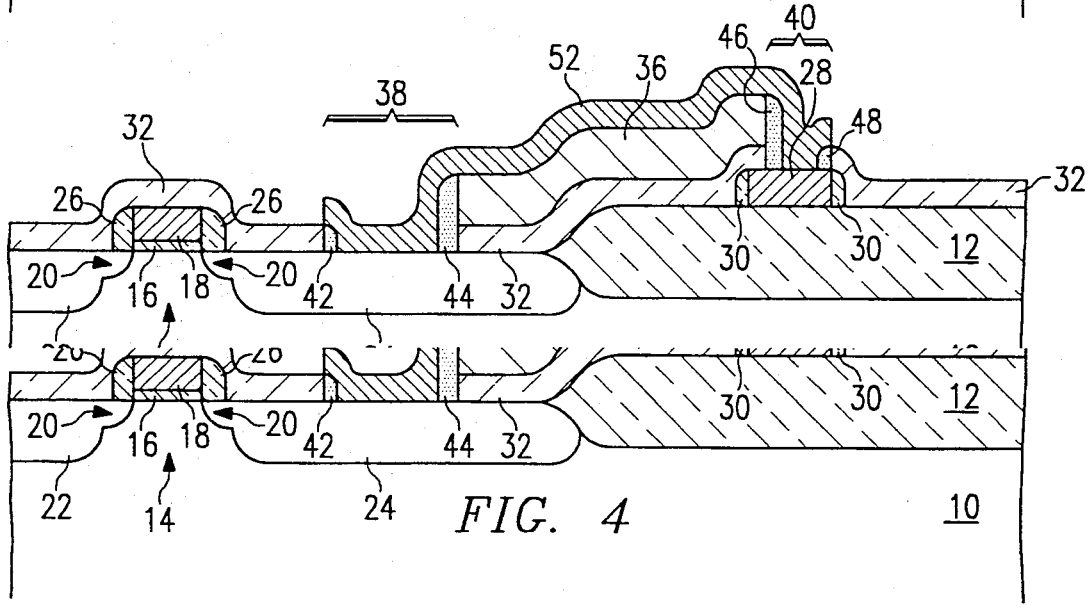

Referring to FIG. 4, the entire device is heated to a temperature sufficient to cause the refractory metal layer 50 to react with underlying silicon and form a refractory metal silicide. Such a refractory metal silicide will be formed on the conductor 36, the polycrystalline silicon sidewall region 42–48, and the exposed surfaces of the source drain region 24 and signal line 28. The silicidation is performed in a nitrogen ambient, and titanium nitride and any remaining titanium are stripped away after the thermal step is completed. If desired, a second thermal cycle can be performed to anneal the silicide. This provides a stable and low resistivity conductor.

The depth to which the silicide layer 52 forms depends upon both the temperature and duration of the thermal cycle. Typical anneal cycles will cause the silicon in the sidewall regions 42–48 to be completely consumed during the silicidation process. Therefore, although a polycrystalline silicon connection is shown as being made between the conductor 36 and each of the conductive regions 24 and 28, it will be typical for only the refractory metal silicide to make such connection. Since the silicide layer provides the primary current conduction for the local interconnect, this presents no problem.

It will be appreciated by those skilled in the art that the connecting bridge formed by the sidewall regions 42, 46, allows a complete connection to be made between the source/drain region 24 and the signal line 28. No unusual process steps are required, with the only additional steps introduced being those of depositing and anisotropically etching a thin polycrystalline silicon layer. Techniques for performing these are well understood by those skilled in the art. Since a silicide is used for the primary current carrying portion of the local interconnect, the underlying polycrystalline silicon layer may be deposited undoped, as is the layer which is etched back to form the sidewall regions 42–48. This avoids any problems which may be caused by connections between a doped polycrystalline silicon interconnect line and underlying conductive regions, one of which is doped P-type and the other doped N-type, such as are found in CMOS integrated circuits.

Variations on the process described above will become apparent to those skilled in the art. For example, a polycided layer may be deposited in place of the polycrystalline silicon layer 34 for definition of the local interconnect layer. Various refractory metals other than titanium may be used, with the circuit designer being able to choose materials which are most compatible with a particular fabrication processes.

As known in the art, small polycrystalline silicon regions are formed along all vertical sidewalls when the thin polycrystalline silicon layer is anisotropically etched back. Such artifacts which are formed along the sides of lower level features are sometimes referred to as "poly sticks". It may be necessary to remove such poly sticks to prevent them from providing an undesired conductive path. If so, after formation of the desired sidewall regions as shown in FIG. 3, the contact openings can be masked with photoresist. An additional etch can then be performed to remove the poly sticks without damaging the connections in the contact region.

While the invention has been particularly shown and described with reference to a preferred embodiment, it will be understood by those skilled in the art that various changes in form and detail may be made therein without departing from the spirit and scope of the invention.

What is claimed is:
1. A conductive local interconnect structure for a semiconductor integrated circuit, comprising:
    a substrate;

a first polycrystalline interconnect layer over said substrate and separated therefrom by a thin gate oxide layer;

an insulating layer over said substrate and said first polycrystalline silicon interconnect layer, said insulating layer being relatively thicker than the thin gate oxide layer and having openings therethrough to conductive regions within said substrate and to a second underlying conductive structure, wherein said second underlying conductive structure comprises a portion of said first polycrystalline silicon interconnect layer;

a first patterned polycrystalline silicon layer overlying a portion of said insulating layer, a portion of the second underlying conductive structure, and a portion of a selected conductive region within said substrate; and first and second connecting polycrystalline silicon regions connected to said first patterned polycrystalline silicon layer and extending to contact the selected conductive substrate region and the second underlying conductive structure, respectively;

at least a portion of said first patterned polycrystalline silicon layer and said first and second connecting polycrystalline silicon regions containing a refractory metal forming a refractory metal silicide, whereby a refractory metal silicide conductor extends from the selected conductive substrate region to said second underlying conductive structure.

2. The conductive structure of claim 1, wherein the refractory metal comprises titanium.

3. The conductive structure of claim 1, wherein the refractory metal silicide conductor also covers said first and second conductive structures exposed in the first and second openings.

4. The conductive structure of claim 1, wherein said first patterned polycrystalline silicon layer does not cross over any other polycrystalline silicon structure.

* * * * *